United States Patent
McGee et al.

(10) Patent No.: US 6,807,107 B1
(45) Date of Patent: Oct. 19, 2004

(54) SEMICONDUCTOR MEMORY WITH SHADOW MEMORY CELL

(75) Inventors: William A. McGee, San Jose, CA (US); Ognjen Milic-Strkalj, San Jose, CA (US); Bruce Alan Gieseke, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 308 days.

(21) Appl. No.: 10/190,396

(22) Filed: Jul. 2, 2002

(51) Int. Cl.[7] .............................................. G11C 16/04
(52) U.S. Cl. ........................... 365/189.01; 365/189.07; 365/189.08; 365/185.21
(58) Field of Search ...................... 365/189.01, 189.07, 365/189.08, 185.21

(56) References Cited

U.S. PATENT DOCUMENTS 6,044,024 A * 3/2000 Barth et al. ............ 365/189.08

* cited by examiner

Primary Examiner—Connie C. Yoha
(74) Attorney, Agent, or Firm—Mikio Ishimaru

(57) ABSTRACT

A memory system having a memory cell subject to read and write operations with shadow circuitry including a shadow cell configured to parallel operation of the memory cell. A wordline is connected to the memory cell and bitlines are connected to the memory cell and the shadow cell. Sense circuitry is connected to the bitlines for receiving data from the memory cell. An interlock cell is connected to the sense circuitry and the shadow cell to determine an occurrence of a non-redundant write operation, to provide the non-redundant write operation to the shadow cell, and to have the shadow cell prepare the bitlines for a read operation upon completion of the non-redundant write operation.

20 Claims, 6 Drawing Sheets

FIG. 2

SEMICONDUCTOR MEMORY WITH SHADOW MEMORY CELL

BACKGROUND

1. Technical Field

The present invention relates generally to memory circuits and more specifically to a semiconductor memory having write-cycles

2. Background Art

Microprocessors are used in many applications including personal computers and other electronic systems. A goal of any microprocessor is to process information quickly. One problem has been the communication rate between a microprocessor and main memory. The instructions to be executed by the microprocessor and the data on which operations implemented by the instructions are to be performed are stored at addresses within main memory. To access instructions and data, the microprocessor transmits addresses to main memory. The main memory decodes the address and makes the contents at the requested address available for reading and/or writing. The time required for the microprocessor to transmit an address to main memory and receive the respective contents therefrom can significantly constrain system performance.

One technique, which is used to increase the speed with which the microprocessor processes information, is to provide the microprocessor with an architecture, which includes a fast local memory called a cache memory A cache memory is a small, fast memory that keeps copies of recently used data or instructions. When these items are reused, they can be accessed from the cache memory instead of main memory. Instead of operating at slower main memory access speeds, the microprocessor can operate at faster cache memory access speeds most of the time.

In order to further increase performance, microprocessors have come to include more than one cache memory on the same semiconductor substrate as the microprocessor.

The most commonly used cache memories use static random access memory (SRAM) circuitry, which provide high densities using wordlines and bitlines to access SRAM memory cells. However, SRAM circuitry requires minimal read/write circuit architectures. To support minimal architectures, a memory cell is accessed by pre-charging a row wordline wire and enabling a selected column-gating transistor to read the value from the memory cell.

The use of memory circuits in battery-operated and other low-voltage devices make it desirable to operate the memory circuits at lowest voltage possible. Typically, when read or write operations are done in memory arrays, the wordline is set high with the power applied while the information stored in the memory cells is read by being transferred onto bitlines or information on the bitlines is written by being stored in the memory cells. For read operations, bitlines are then read by a sense-amp. For write operations, information on the bitlines change the held charge in the memory cell.

In a read-modify-write scheme, reading and writing occur in the same clock cycle, reading in the first half, writing in the second. A major problem occurs when the bitline is pulled low in the course of the write instruction. The same bitline must be fully pre-charged before the beginning of the next full cycle in anticipation of a read phase. Beginning the pre-charge process too late can corrupt the next read operation, whereas beginning the pre-charge process too early before the write operation has finished can end up storing an improper value.

Further complicating the process is the small amount of time the operations must occur in. Although pre-charging is a relatively quick process, at a clock speed 2 GHz, the entire write phase including writing and pre-charging, must take place in less 250 picoseconds. As clock speeds increase in the future, it becomes increasingly important to know exactly when the write operation has completed and it is safe to begin pre-charging. Unfortunately, there is no way to directly monitor an individual memory cell within a densely packed memory array without adding more wires and adversely affecting the density and speed of the memory. Thus, as speed increases, the reliability decreases because of the uncertainty of when pre-charging should begin.

A solution to this problem has been long sought but has long eluded those skilled in the art.

DISCLOSURE OF THE INVENTION

The present invention provides a memory system having a memory cell subject to read and write operations with shadow circuitry including a shadow cell configured to parallel operation of the memory cell. A wordline is connected to the memory cell and bitlines are connected to the memory cell and the shadow cell. Sense circuitry is connected to the bitlines for receiving data from the memory cell. An interlock cell is connected to the sense circuitry and the shadow cell to determine an occurrence of a non-redundant write operation, to provide the non-redundant write operation to the shadow cell, and to have the shadow cell prepare the bitlines for a read operation upon completion of the non-redundant write operation. This makes it possible to know when a write operation has been completed and a safe pre-charging of the bitlines can be performed.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 2 is a simplified block-diagram of a circuit for detecting write-cycle completion in accordance with the present invention;

BEST MODE FOR CARRYING OUT THE INVENTION

Figure 1:
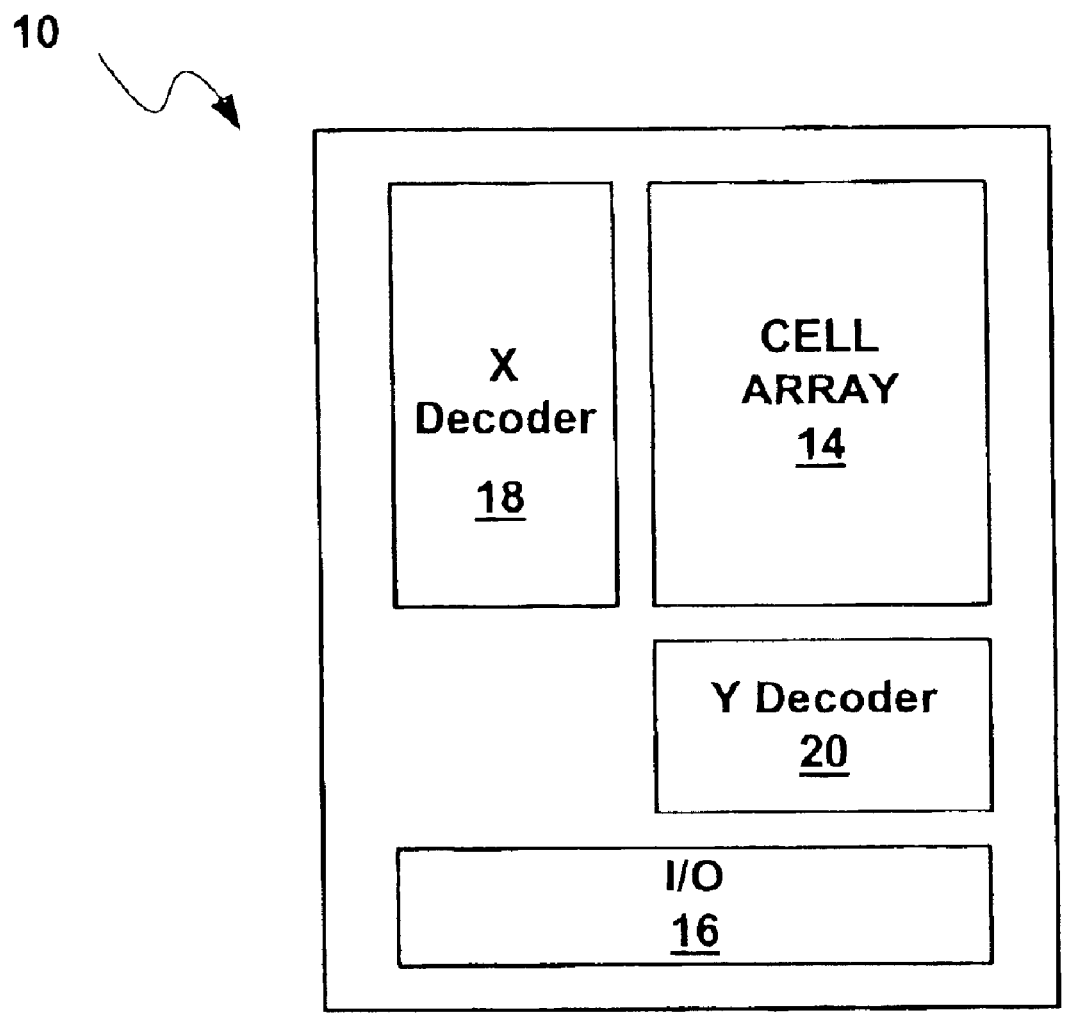
FIG. 1 is a plan view of a static random access memory in accordance with the present invention.

Referring now to FIG. 1, therein is shown a block diagram of an SRAM 10, which commonly includes a core of one or more M×N arrays 14 of individually addressable, substantially identical memory cells. Peripheral portions typically include input/output (I/O) circuitry 16 and decoding circuitry for selectively addressing the individual memory cells in accordance with the present invention. The address decoding circuitry is represented in part by and includes one or more x-decoders 18 and y-decoders 20, cooperating with I/O circuitry 16 for connecting the source, gate, and drain of selected addressed memory cells to predetermined voltages or impedances to effect designated operations on the memory cell, e.g., programming, writing, reading, erasing, and deriving necessary voltages to effect such operations.

Figure 2:
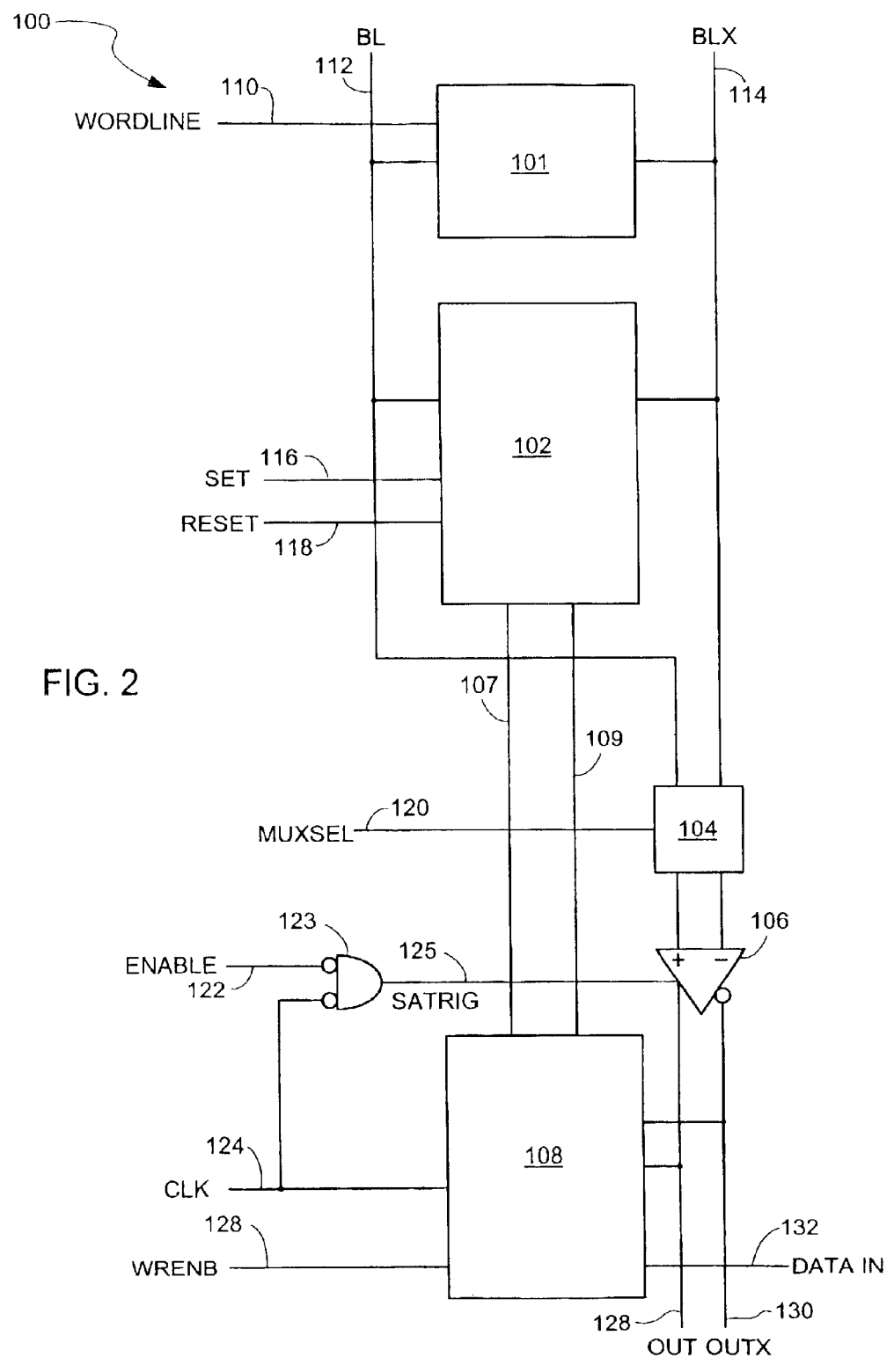

Referring now to FIG. 2, therein is shown a simplified block-diagram of portion of the SRAM cache memory 10 of FIG. 1 including a write-cycle detector 100 in accordance with the present invention. Another memory cell 101 of the cache memories 14 of FIG. 1 is connected with shadow circuitry 102, a multiplexer 104, a sense-amp 106, and an interlock cell 108 across a bitline BL 112 and a complementary bitline BLX 114. A signal on a wordline 110 (referred to as "wordline signal 110") activates the memory cell 101 to write data from or read data to the bitline 112 and the complementary bitline 114. The shadow circuitry 102 includes circuits which duplicate the memory cell 101, but which can be monitored so as to indicate the state of the memory cell 101. The interlock cell 108 determines whether or not a write operation is redundant, as will later be explained.

In a read operation, the wordline signal 110 has been pre-charged high (to a digital "1") so data from the memory cell 101 is transferred onto the bitlines 112 and 114. The data being read passes through the multiplexer 104 when a multiplexer select (MUXSEL) signal 120 goes low. The data is then read by the sense-amp 106 when a sense-amp trigger (SATRIG) signal 125 goes high. The SATRIG signal 125 is the output of a NOR gate 123 using a read-enable (ENABLE) signal 122 and a clock (CLK) signal 124 as inputs. The CLK signal 124 is the global clock for the circuit. The sense-amp 106 produces an OUT signal 128 and a complementary OUTX signal 130. Sense-amps are circuits, which are well known in the art and are common to all memories whether the memories are dynamic, static, non-volatile (flash, EEPROM), or other types of memories.

Prior to a write operation, a SET signal 116 or a RESET signal 118 has already been provided by set/reset circuitry (not shown) to ready the shadow circuitry 102 to bring it the "armed" (in the set case) or "unarmed" (in the case of reset) position (as will be later explained in detail). During a write operation, the data to be written is on a data-in (DATAIN) signal 132 to the interlock cell 108. The interlock cell 108 uses the data read onto the OUT signal 128 and the complementary OUTX signal 130 from the prior read operation to determine whether or not a write operation would be redundant.

If the write operation would not change the value of the data just read out, it is redundant and there is no need for a write operation.

If the write operation would change the value of the data, it is not redundant and, if writing is enabled with a write-enable (WRENB) signal 126, the DATAIN signal 132 is transferred to the shadow circuitry 102 through feedback lines 107 and 109 and from there, transferred to the bitlines 112 and 114. A write operation is then performed to the memory cell 101.

As soon as the write operation is finished, pre-charging must begin. However, as previously described, the memory cell 101 is not monitored to determine when the write operation is finished. To solve this problem, the shadow circuitry 102 simultaneously performs the same write operation as the memory cell 101. Because the shadow circuitry 102 is designed to write slightly slower than the memory cell 101, by the time the shadow circuitry 102 has completed its write operation, the memory cell 101 is guaranteed to have completed its own. As the shadow circuitry 102 is not in a dense memory array like the memory cell 101, monitoring the status of the write operation is possible. Thus, pre-charging is turned on as soon as the shadow circuitry 102 has completed its write operation, preparing the circuit for a read operation in time for the next clock cycle and after the completion of the write operation so as not to corrupt the written data.

Figure 3:
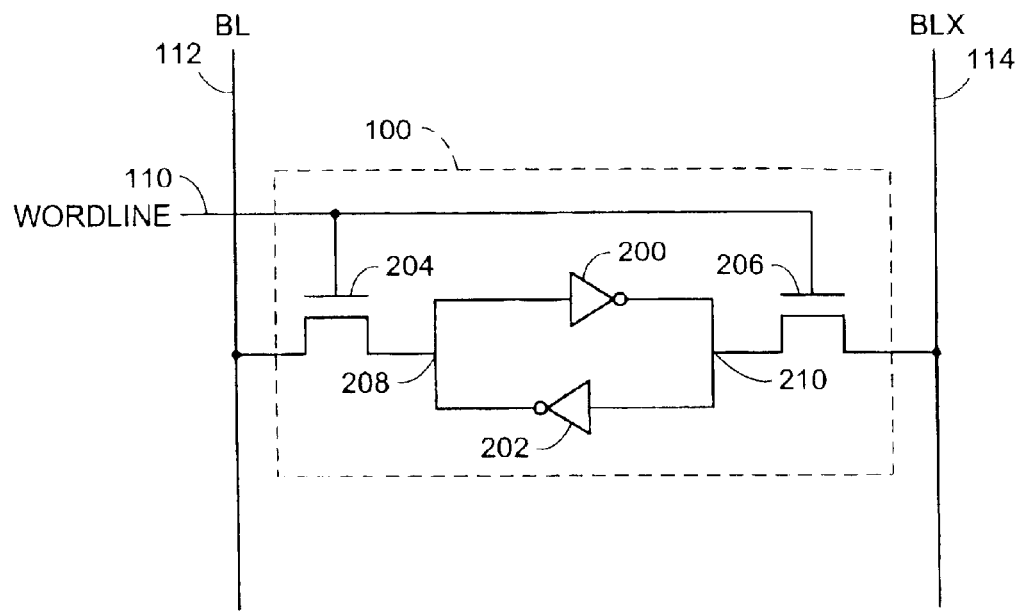
FIG. 3 is a schematic diagram of a RAM cell in accordance with the present invention.

Referring now to FIG. 3, therein is shown a schematic diagram of the memory cell 101 with inverters 200 and 202 cross-coupled. Pass gates 204 and 206 are connected to the wordline signal 110 and the inverters 200 and 202. The pass gate 204 is connected to the bitline 112 and the pass gate 206 is connected to the complementary bitline 114. A node 208 is formed where the pass gate 204 and the inverters 200 and 202 meet, and a node 210 is formed where the pass gate 206 and the inverters 200 and 202 meet.

Figure 4:
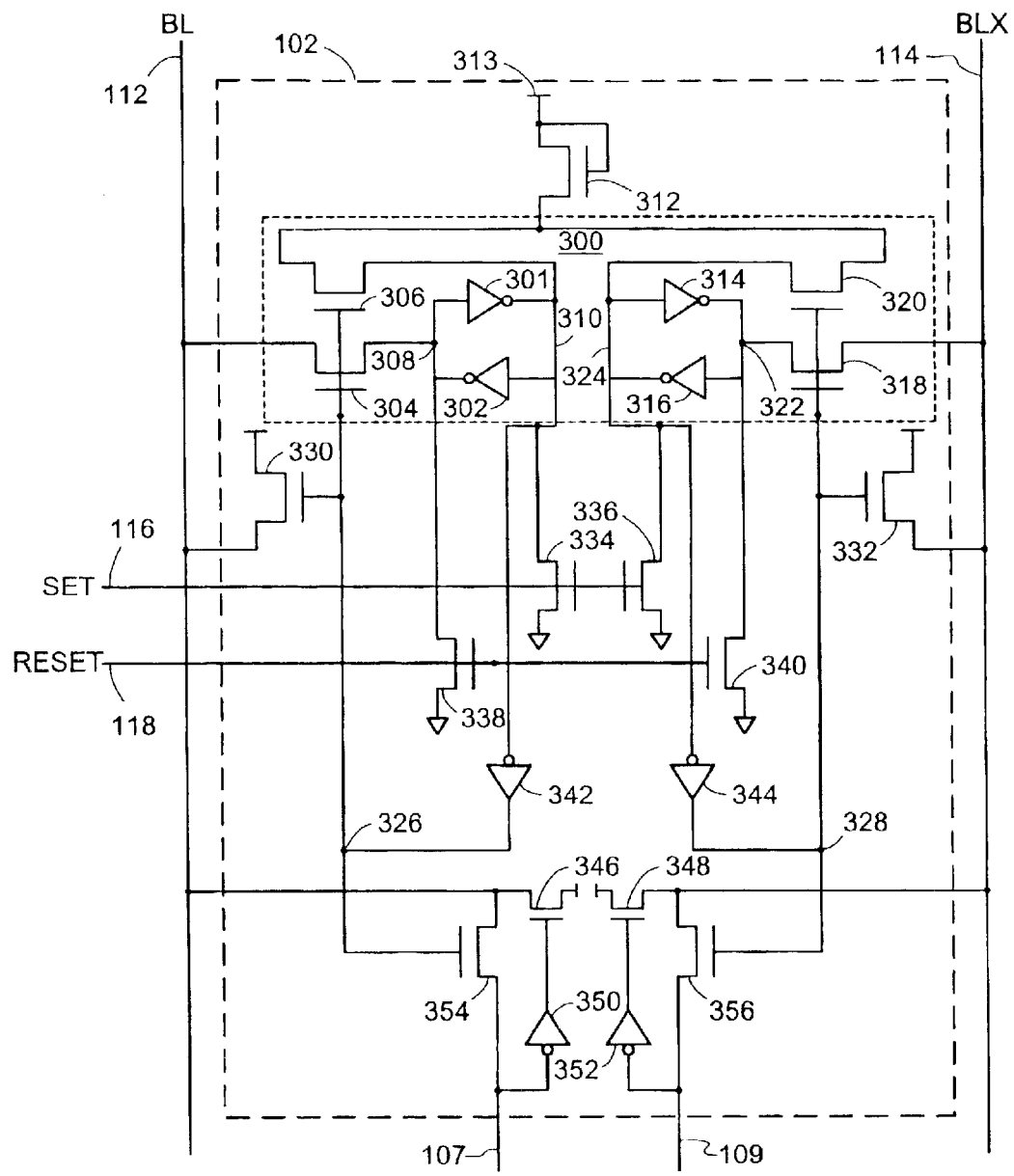
FIG. 4 is a schematic level diagram of shadow circuitry in accordance with the present invention.

Referring now to FIG. 4, therein is shown a schematic-level diagram of the shadow circuitry 102 including two complementary RAM cells, referred to collectively as shadow cell 300, which "shadow" the memory cell 101, essentially duplicating the write operation with a small time delay.

Inverters 301 and 302 are cross-coupled. A pass gate 304 is connected at a node 308 and a pass gate 306 is connected at a complementary node 310 to the inverters 301 and 302. The pass gate 304 is connected to the bitline 112 and the pass gate 306 is connected via an NMOS transistor 312 to a supply voltage VDD 313.

Similarly, inverters 314 and 316 are cross-coupled. A pass gate 318 is connected at a node 322 and a pass gate 320 is connected at a complementary node 324 to the inverters 314 and 316.

The pass gate 318 is connected to the complementary bitline 114 and the pass gate 320 is connected via the NMOS transistor 312 to the supply voltage VDD 313. The NMOS transistor 312 provides the built-in delay.

The pass gates 304 and 306 are connected to a node 326 and the pass gates 318 and 320 are connected to a node 328.

Strong PMOS pre-chargers 330 and 332 are connected to the supply voltage VDD 313, the bitlines 112 and 114 respectively, and to the nodes 326 and 328 respectively. They are off during write operations and turn on, pre-charging the bitlines to the supply voltage VDD 313 level when the nodes 326 and 328 go low. These nodes go low when a write operation has been completed, thus triggering a strong pre-charge to ready the circuit for the next clock cycle.

Transistors 334 and 336 are connected to the nodes 310 and 324 respectively, and are controlled by the SET signal 116. When the SET signal 116 is on, the transistors 334 and 336 pull the nodes 310 and 324 low, thus shutting off the strong PMOS pre-chargers 330 and 332, respectively.

Transistors 338 and 340 are respectively connected to the nodes 308 and 322 and are controlled by the RESET signal 118. When turned on by their respective control signals, they act as resistors, connecting their nodes to ground.

In the embodiment shown with only one pair of bitlines sharing one sense-amp, the sense-amp 106, the RESET signal 118 is not needed. In cases where there are more than one pair of bitlines, the RESET signal 118 helps select which bitline pair has access to the sense-amp 106.

An inverter 342 connects the nodes 310 and 326, and an inverter 344 connects the nodes 324 and 328.

Weak pre-chargers 346 and 348 are approximately 5 times weaker than the strong PMOS pre-chargers 330 and 332. They are connected to the supply voltage VDD 313, the bitlines 112 and 114, and NMOS write multiplexers (MUXs) 354 and 356, and are controlled by the inverters 350 and 352, respectively. The weak pre-chargers 346 and 348 help keep the bitlines 112 and 114 high, but they are disabled by the inverters 350 and 352 when the bitlines need to be pulled low during write. The NMOS write MUXs 354 and 356 are connected to the nodes 326 and 328 respectively and they share, as inputs, with the inverters 350 and 352, the feedback lines 107 and 109, which act as the outputs of the interlock cell 108.

Figure 5:
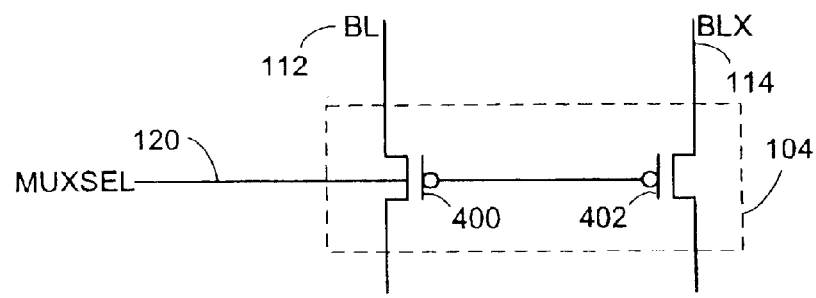
FIG. 5 is a schematic-level diagram of a multiplexer in accordance with the present invention.

Referring now to FIG. 5, therein is shown the multiplexer 104. The embodiment with a single bitline pair using the sense-amp 106 does not require the use of a multiplexer, however, the multiplexer 104 is required when the multiple bitlines pair share the sense-amp 106. In these embodiments, the multiplexer 104 would select the proper bitline pair for read and write operations. The MUXSEL signal 120 is connected to the bitlines 112 and 114 through read MUXs 400 and 402. When they are selected by the MUXSEL signal 120, the bitline data is transferred to the sense-amp 106.

Figure 6:
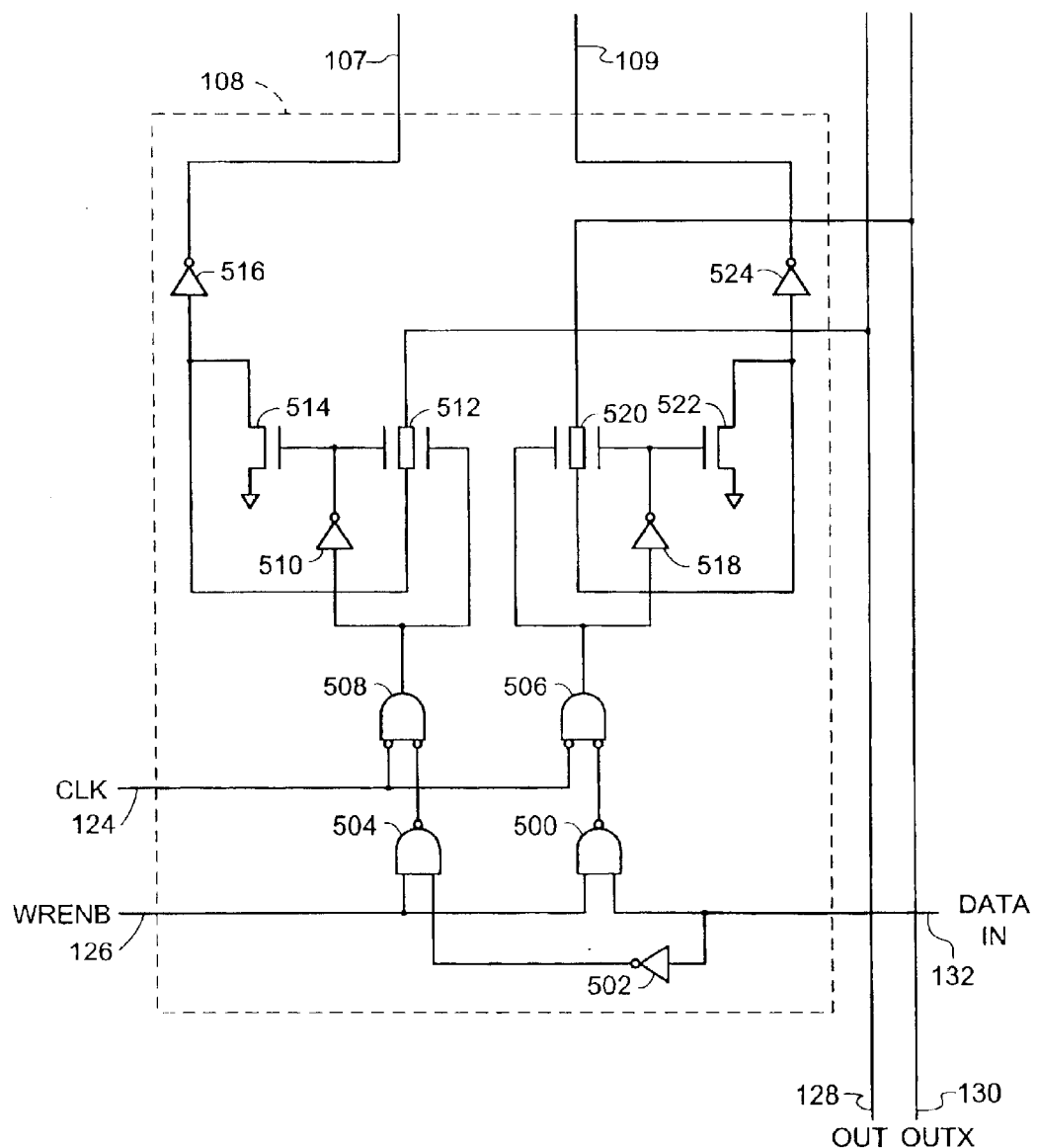
FIG. 6 is a schematic-level diagram of a interlock cell in accordance with the present invention.

Referring now to FIG. 6, therein is shown the interlock cell 108 which allows the writing process to occur only if the data to be written is different from the data which is already stored in the memory cell 101.

The interlock cell 108 includes a NAND gate 500, which takes the DATAIN signal 132 and the WRENB signal 126 as inputs.

Similarly, a NAND gate 504 takes as inputs the inverse of the DATAIN signal 132 from an inverter 502 and the WRENB signal 126. A NOR gate 506 takes the output of the NAND gate 500 and the CLK signal 124 as inputs, and another NOR gate 508 takes the output of the NAND gate 504 and the WRENB signal 126 as inputs.

The output of the NOR gate 508 controls a pass gate 512 and is connected directly, and through an inverter 510. The pass gate 512 is also connected to the OUT signal 128. The output of the inverter 510 is also connected to a transistor 514, which is connected to ground and the input of an inverter 516. The output of the inverter 516 is connected to the shadow circuitry 102. When the output of the NOR gate 508 is high, the pass gate 512 will open and allow the OUT signal 128 to propagate through the inverter 516 and on to the shadow circuitry 102. When the output of the NOR gate 508 is low, the pass gate 512 is closed, the transistor 514 is open, and the inverter 516 is connected through it to ground.

The output of the NOR gate 506 controls a pass gate 520 and is connected directly, and through an inverter 518. The pass gate 520 is also connected to the OUTX signal 130. The output of the inverter 518 is also connected to a transistor 522, which is connected to ground and the input of an inverter 524. The output of the inverter 524 is connected to the shadow circuitry 102. When the output of the NOR gate 506 is high, the pass gate 520 will open and allow the OUTX signal 130 to propagate through the inverter 524 and on to the shadow circuitry 102 via the feedback lines 107 and 109. When the output of the NOR gate 506 is low, the pass gate 520 is closed, the transistor 522 is open, and the inverter 524 is connected through it to ground.

Figure 7:
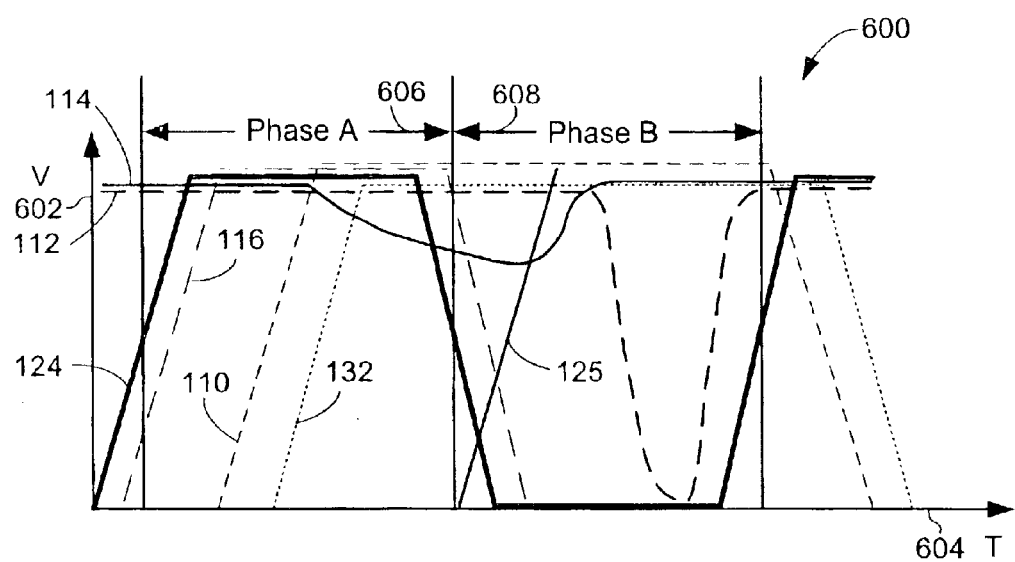
FIG. 7 is a timing diagram of a read and write operation in accordance with the present invention.

Referring now to FIG. 7, therein is shown a timing diagram 600 depicting reading and writing in the same cycle. A Y-axis 602 of the diagram represents the voltage level and an X-axis 604 represents time. The CLK signal 124 is cyclic and a full cycle and part of a subsequent cycle are shown. The CLK signal 124 also has two phases: Phase A and Phase B measured from about the middle of the rise and fall times such that the CLK signal 124 is going high to a digital one in the beginning of Phase A, low to a digital zero in the beginning of Phase B, and high to a digital one in the beginning of the next subsequent phase. In the present invention, Phase A is a read phase 606 and Phase B is a write phase 608.

In the read phase 606, the CLK signal 124 rises and the SET signal 116 follows. The SET signal 116 prepares ("arms") the shadow circuitry 102 for a write instruction in the next phase. It causes the nodes 310 and 324 in FIG. 2 to be discharged via the transistors 334 and 336.

When the nodes 310 and 324 go low, the inverters 342 and 344 go high, connecting the nodes 308 and 322 to bitlines 112 and 114 respectively. It also connects the nodes 310 and 324 to the supply voltage VDD 313 through the NMOS transistor 312. The output of the inverters 342 and 344 also shut down the strong PMOS pre-chargers 330 and 332 and opens the NMOS write MUXs 354 and 356.

Still in the read phase 606, the wordline signal 110 rises, transferring the voltages of the nodes 208 and 210 in the memory cell 101 of FIG. 2 onto the bitlines 112 and 114. The voltage differential between the two bitlines increases, as evidenced by their separation on the timing diagram 600, until the sense-amp 106 is triggered by the SATRIG signal 125 going high. The bitline will then begin recovering.

In the write phase 608, the bitline being written takes on the value of the DATAIN signal 132. In the case that that value is low, the bitline is pulled down to a logical low level, and must be returned to the supply voltage VDD 313 as quickly as possible after the conclusion of the write operation.

For example, when the node 208 of the memory cell 101 is a "1," or logical high, and the DATAIN signal 132 is a "1," or logical low, the CLK signal 124 falls at the onset of the write phase 608. This triggers the sense-amp 106 through the NOR gate 123 and causes the non-inverting output of the sense-amp 106 to go "high." The DATAIN signal 132, inverted by the inverter 502, causes the output of the NAND gate 504 to go low, which in turn causes the output of the NOR gate 508 to become high, opening the pass gate 512 and causing the inverter 516 to go low.

Because the NMOS write MUX 354 is open, the "write pulse," as it is sometimes referred to, propagates through to both the memory cell 101 and the shadow cell 300, forcing both the node 208 in the memory cell 101 and the node 308 in the shadow cell 300 low, and their complements nodes 210 and 310 high. When the node 310 goes high, indicating in the shadow cell 300 that the write operation has been completed, the node 326 goes low, shutting off the NMOS write MUX 354 and activating the strong PMOS pre-charger 330 and pulling the bitline 112 back to the supply voltage VDD 313 potential very quickly, well before the start of the next phase of the CLK signal 124.

It should be noted that the configuration for each of the complementary RAM cells in the shadow cell 300 are identical to the memory cell 101 except that they are designed to perform the write instructions slightly slower due to the built-in delay provided by the extra NMOS transistor 312. Because of this delay, the node 310 goes high slightly after the node 210 would, guaranteeing that the write operation is finished before the pre-charging occurs.

While the invention has been described in conjunction with a specific best mode, it is to be understood that many alternatives, modifications, and variations will be apparent

The invention claimed is:

1. A memory system comprising:
   a memory cell subject to read and write operations;
   shadow circuitry including a shadow cell configured to parallel operation of the memory cell;
   a wordline connected to the memory cell;
   bitlines connected to the memory cell and the shadow cell;
   sense circuitry connected to the bitlines for receiving data from the memory cell; and
   an interlock cell connected to the sense circuitry and the shadow cell to determine an occurrence of a write operation, to provide the write operation to the shadow cell, and to have the shadow cell prepare the bitlines for a read operation upon completion of the write operation.

2. The memory system as claimed in claim 1 wherein the memory cell has a first circuit layout and the shadow cell has two complementary circuits each having a second circuit layout identical to the first circuit layout.

3. The memory system as claimed in claim 1 wherein the interlock cell includes write-sense circuitry for sensing completion of the write operation in the shadow cell.

4. The memory system as claimed in claim 1 wherein the shadow circuitry includes delay circuitry to slow write operations to the shadow cell compared to the write operations to the memory cell.

5. The memory system as claimed in claim 1 wherein the interlock cell includes circuitry to compare successive write operations to the memory cell to determine when a write operation is a non-redundant write operation and to cause the interlock cell to provide only the non-redundant write operations to the shadow cell.

6. The memory system as claimed in claim 1 wherein the memory cell is subject to redundant and non-redundant write operations and the interlock cell includes logic circuitry to eliminate redundant write operations.

7. The memory system as claimed in claim 1 wherein the interlock cell has circuitry to cause the shadow circuitry to prepare the bitlines for a subsequent read operation after the write operation.

8. The memory system as claimed in claim 1 wherein the shadow circuitry includes pre-charging circuitry connected to the bitlines.

9. The memory system as claimed in claim 1 wherein the shadow circuitry includes set circuitry to clear the shadow cell.

10. The memory system as claimed in claim 1 including multiplexing circuitry connected to the bitlines between the memory cell and the sensing circuitry for selectively connecting the memory cell to the sensing circuitry.

11. A memory system comprising:
    a memory array including a memory cell subject to read and write operations;
    shadow circuitry including a shadow cell configured to parallel operation of the memory cell;
    a wordline connected to the memory cell responsive to a wordline signal to activate the memory cell for the read and write operations;
    bitlines connected to the memory cell and the shadow cell;
    sense circuitry connected to the bitlines to receive data from the memory cell and to amplify the data to provide an amplified data signal; and
    an interlock cell connected to the sense circuitry and the shadow cell responsive to clock, write-enable, amplified data, write, and data-in signals to determine an occurrence of a non-redundant write operation, to provide the write operation to the shadow cell, and to have the shadow cell prepare the bitlines for a read operation upon completion of the write operation.

12. The memory system as claimed in claim 11 wherein the memory cell has a first circuit layout and the shadow cell has two complementary circuits each having a second circuit layout identical to the first circuit layout for identical operation therebetween.

13. The memory system as claimed in claim 11 wherein the interlock cell includes write-sense circuitry for sensing completion of the write operation in the shadow cell.

14. The memory system as claimed in claim 11 wherein the shadow circuitry includes delay circuitry to slow write operations to the shadow cell compared to the write operations to the memory cell.

15. The memory system as claimed in claim 11 wherein the interlock cell includes circuitry to compare successive write operations to the memory cell to determine when a write operation is a non-redundant write operation and to cause the interlock cell to provide only the non-redundant write operations to the shadow cell.

16. The memory system as claimed in claim 11 wherein the memory cell is subject to redundant and non-redundant write operations and the interlock cell includes logic circuitry to eliminate redundant write operations and send non-redundant write operations to the shadow cell.

17. The memory system as claimed in claim 11 wherein the interlock cell has circuitry to cause the shadow circuitry to prepare the bitlines for a subsequent read operation after the write operation.

18. The memory system as claimed in claim 11 wherein the shadow circuitry includes pre-charging circuitry connected to the bitlines to pre-charge the bitlines to a logical one after a write operation.

19. The memory system as claimed in claim 11 wherein the shadow circuitry includes set and reset circuitry to clear the shadow cell.

20. The memory system as claimed in claim 11 wherein:
    the memory array includes a plurality of memory cells; and
    including:
    a further plurality of bitlines connected to the plurality of memory cells, and
    multiplexing circuitry connected between the plurality of memory cells and the sensing circuitry for selectively connecting pairs of the plurality of bitlines to the sensing circuitry.

* * * * *